United States Patent
Cho et al.

(10) Patent No.: US 10,879,007 B2
(45) Date of Patent: Dec. 29, 2020

(54) ELECTRONIC COMPONENT

(71) Applicant: SAMSUNG ELECTRO-MECHANICS CO., LTD., Suwon-si (KR)

(72) Inventors: Beom Joon Cho, Suwon-si (KR); Ki Young Kim, Suwon-si (KR); Jae Young Na, Suwon-si (KR)

(73) Assignee: SAMSUNG ELECTRO-MECHANICS CO., LTD., Suwon-si (KR)

( * ) Notice: Subject to any disclaimer, the term of this patent is extended or adjusted under 35 U.S.C. 154(b) by 0 days.

(21) Appl. No.: 16/210,595

(22) Filed: Dec. 5, 2018

(65) Prior Publication Data

US 2020/0126728 A1 Apr. 23, 2020

(30) Foreign Application Priority Data

Oct. 23, 2018 (KR) .................. 10-2018-0126757

(51) Int. Cl.
*H01G 4/30* (2006.01)
*H01G 2/06* (2006.01)
(Continued)

(52) U.S. Cl.
CPC .............. *H01G 4/30* (2013.01); *H01G 2/065* (2013.01); *H01G 4/0085* (2013.01);
(Continued)

(58) Field of Classification Search
CPC .......... H01G 4/224; H01G 4/248; H01G 4/30; H01G 4/38; H01G 4/012; H01G 4/1227;
(Continued)

(56) References Cited

U.S. PATENT DOCUMENTS

2012/0300361 A1* 11/2012 Togashi .................. H01G 4/30
361/301.4
2015/0114697 A1* 4/2015 Murrell ................. H01G 4/232
174/255
(Continued)

FOREIGN PATENT DOCUMENTS

JP 2014-146642 A 8/2014
JP 2014-203862 A 10/2014
(Continued)

OTHER PUBLICATIONS

Notice of Office Action issued in Korean Patent Application No. 10-2018-0126757 dated Jan. 6, 2020 (With English Translation).
Notice if Office Action dated May 22, 2020 in Korean Patent Application No. 10-2018-0126757 dated May 22, 2020 (English translation).

*Primary Examiner* — Michael P McFadden
(74) *Attorney, Agent, or Firm* — Morgan, Lewis & Bockius LLP (57) ABSTRACT

An electronic component includes a capacitor array including a plurality of multilayer capacitors disposed in a vertical direction, among the multilayer capacitors, adjacent multilayer capacitors including opposing external electrodes, including band portions bonded to each other, the external electrodes being disposed in such a manner that a band portion disposed on a bonding surface has an area relatively larger than an area of a band portion disposed on a further surface, and a pair of metal frames, each including a vertical portion bonded to a head portion of an external electrode of a lowermost multilayer capacitor and a mounting portion bent at a lower end of the vertical portion to extend.

20 Claims, 10 Drawing Sheets

(51) Int. Cl.
    *H01G 4/248*     (2006.01)
    *H01G 4/40*     (2006.01)
    *H01G 4/008*     (2006.01)
    *H01G 4/38*     (2006.01)
    *H05K 1/02*     (2006.01)
    *H01G 4/12*     (2006.01)

(52) U.S. Cl.
    CPC ............... *H01G 4/248* (2013.01); *H01G 4/38* (2013.01); *H01G 4/40* (2013.01); *H01G 4/12* (2013.01); *H05K 1/0231* (2013.01)

(58) Field of Classification Search
    CPC .... H01G 4/1245; H01G 4/065; H01G 4/0085; H01G 4/40; H01G 4/12; H05K 1/0231
    See application file for complete search history.

(56) References Cited

U.S. PATENT DOCUMENTS

2016/0086734 A1     3/2016   Park et al.
2016/0219739 A1*   7/2016   Park ........................ H01G 4/30

FOREIGN PATENT DOCUMENTS

| | | |
|---|---|---|
| JP | 2016-535445 A | 11/2016 |
| KR | 10-2011-0129977 A | 12/2011 |
| KR | 10-2016-0035490 A | 3/2016 |
| KR | 10-2016-0092251 A | 8/2016 |
| WO | 2010/111575 A2 | 9/2010 |
| WO | 2015/065974 A1 | 5/2015 |

\* cited by examiner

ELECTRONIC COMPONENT

CROSS-REFERENCE TO RELATED APPLICATION(S)

This application claims benefit of priority to Korean Patent Application No. 10-2018-0126757 filed on Oct. 23, 2018 in the Korean Intellectual Property Office, the disclosure of which is incorporated herein by reference in its entirety.

TECHNICAL FIELD

The present disclosure relates to an electronic component.

BACKGROUND

Multilayer capacitors have been used in various electronic devices due to advantages thereof such as compactness and high capacitance.

Recently, due to rapid rise in popularity of eco-friendly vehicles and electric vehicles, power driving systems in vehicles have increased, so that demand for a multilayer capacitors required in such vehicles has increased.

In order to be used as a component for a vehicle, since a multilayer capacitor should have a high level of thermal resistance or electrical reliability, a required level of performance of the multilayer capacitor has gradually been increased.

Therefore, a structure of a multilayer capacitor having improved resistance to vibrations or deformation has been required.

In detail, there is a demand for an electronic device having a structure configured to implement high capacitance through a plurality of capacitors being stacked or a structure of an electronic component having improved resistance to vibrations or deformation.

SUMMARY

An aspect of the present disclosure is to provide a stack-type electronic component which has improved resistance to vibrations and deformation and improved reliability, and increases adhesion force between components while implementing high capacitance.

According to an aspect of the present disclosure, an electronic component includes a capacitor array including first and second multilayer capacitors disposed in a vertical direction, the first and second multilayer capacitors including opposing external electrodes including band portions bonded to each other, the external electrodes being disposed in such a manner that a band portion disposed on a bonding surface has an area larger than an area of a band portion disposed on a further surface other than the bonding surface; and a pair of metal frames, each including a vertical portion bonded to a head portion of a respective one of the external electrodes of the first multilayer capacitor and a mounting portion bent at a lower end of the vertical portion.

The band portion disposed on the bonding surface may include an extending portion, extending in a length direction.

The electronic component may further include a conductive bonding portion disposed between the head portion of the respective external electrode of the first multilayer capacitor and the vertical portion.

The mounting portion may be spaced apart from a lower end of the capacitor array.

Each of the first and second multilayer capacitors may include a body including dielectric layers and first and second internal electrodes alternately disposed with each of the dielectric layers interposed therebetween and first and second external electrodes disposed on both end portions of the body, respectively. Each of the first and second external electrodes may include first and second head portions disposed on both end surfaces of the body to be electrically connected to the first and second internal electrodes, respectively, and first and second band portions extending from the first and second head portions to portions of top and bottom surfaces of the body, respectively.

Each of the metal frames may include an extending portion extending from an upper end of the vertical portion to be bonded to a head portion of a respective one of the external electrodes of the second multilayer capacitor.

The electronic component may further include conductive bonding portions disposed between the head portion of the respective external electrode of the first multilayer capacitor and the vertical portion and between the head portion of the respective external electrode of the second multilayer capacitor and the extending portion.

Each of the metal frames may further include a bonding portion bent from the vertical portion to extend between opposing band portions of the first and second multilayer capacitors.

The electronic component may further include conductive bonding portions disposed between the bonding portion and the opposing band portions of the first and second multilayer capacitors.

The capacitor array may further include a plurality of multilayer capacitors disposed in a horizontal direction.

According to an aspect of the present disclosure, an electronic component includes first and second multilayer capacitors, a first external electrode of the first multilayer capacitor including a first band portion bonded to a second band portion of a second external electrode of the second multilayer capacitor; and a metal frame including a vertical portion bonded to a head portion of the first external electrode of the first multilayer capacitor, and a mounting portion bent at a lower end of the vertical portion and spaced apart from a first external electrode of the first multilayer capacitor. In a direction perpendicular to the head portion of the first external electrode, the first band portion of the first external electrode is longer than another band portion of the first external electrode and the second band portion of the second external electrode is longer than another band portion of the second external electrode.

The electronic component may further include a conductive bonding portion disposed between the head portion of the first external electrode of the first multilayer capacitor and the vertical portion.

The metal frame may include an extending portion extending from an upper end of the vertical portion to be bonded to a head portion the second external electrode of the second multilayer capacitor.

The electronic component may further include conductive bonding portions disposed between the head portion of the first external electrode of the first multilayer capacitor and the vertical portion and between the head portion of the second external electrode of the second multilayer capacitor and the extending portion.

The metal frame may further include a bonding portion bent from the vertical portion to extend between the band portions of the first and second multilayer capacitors.

The electronic component may further include conductive bonding portions disposed between the bonding portion and the band portions of the first and second multilayer capacitors.

The electronic component may further include a plurality of multilayer capacitors disposed in a horizontal direction perpendicular to a stacking direction of the first and second multilayer capacitors.

BRIEF DESCRIPTION OF DRAWINGS

The above and other aspects, features, and advantages of the present disclosure will be more clearly understood from the following detailed description, taken in conjunction with the accompanying drawings, in which.

DETAILED DESCRIPTION

Hereinafter, embodiments of the present disclosure will be described as follows with reference to the attached drawings.

Hereinafter, embodiments of the present disclosure will be described as follows with reference to the attached drawings. The present disclosure may, however, be embodied in many different forms and should not be construed as being limited to the embodiments set forth herein. Rather, these embodiments are provided so that this disclosure will be thorough and complete, and will fully convey the scope of the invention to those skilled in the art.

In the drawings, the shapes and dimensions of elements may be exaggerated for clarity, and the same reference numerals will be used throughout to designate the same or like elements.

Through the specification, in addition, unless explicitly described to the contrary, the word "comprise" and variations such as "comprises" or "comprising," will be understood to imply the inclusion of stated elements but not the exclusion of any other elements.

Directions of a hexahedral ceramic body will be defined in order to clearly describe an embodiment of the invention. L, W and T shown throughout the drawings refer to a length direction, a width direction, and a thickness direction of a multilayer ceramic capacitor and an electronic component, respectively. Here, the Z direction may be the same as a direction in which dielectric layers are laminated.

Figure 1:
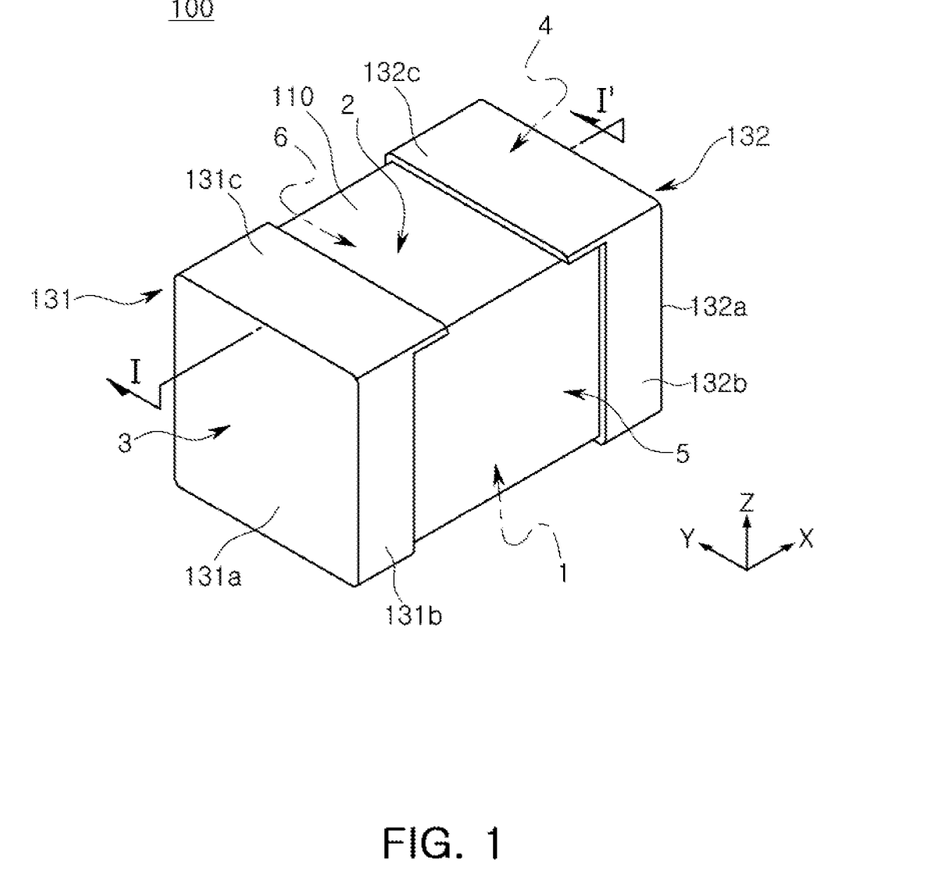
FIG. 1 is a perspective view of a multilayer capacitor applied to an exemplary embodiment in the present disclosure.
Figure 2A:
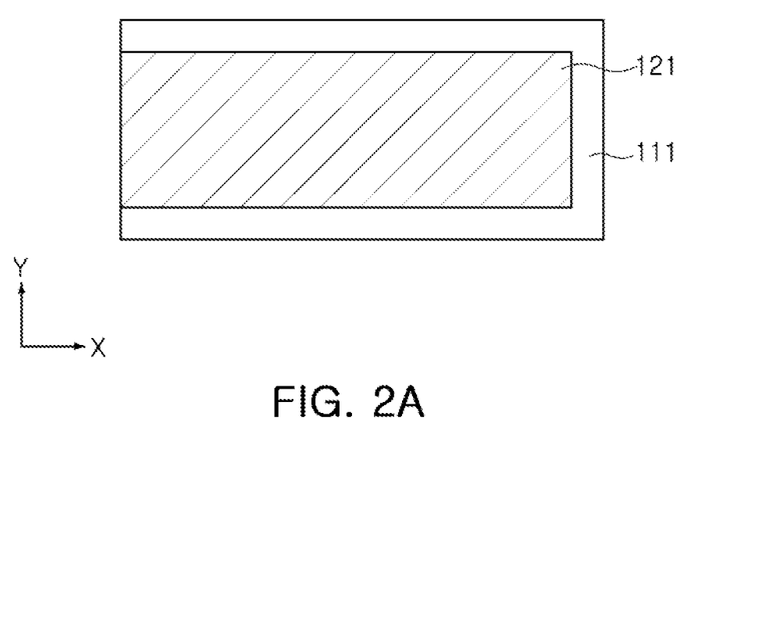
FIGS. 2A and 2B are plan views of first and second internal electrodes applied to the multilayer capacitor in FIG. 1, respectively.
Figure 2B:
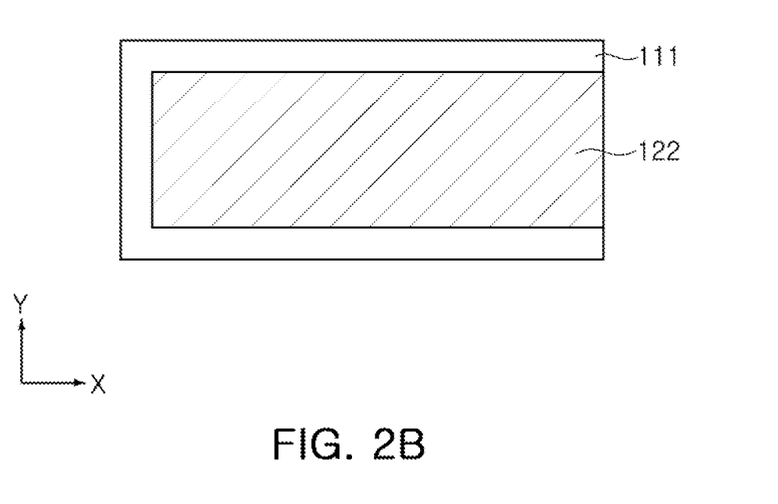

FIG. 1 is a perspective view of a multilayer capacitor applied to an exemplary embodiment in the present disclosure. FIGS. 2A and 2B are plan views of first and second internal electrodes applied to the multilayer capacitor in FIG. 1, respectively, while FIG. 3 is a cross-sectional view taken along line I-I' in FIG. 1.

Hereinafter, a structure of a multilayer capacitor applied to an electronic component according to the present embodiment will be described with reference to FIGS. 1 to 3.

Figure 3:
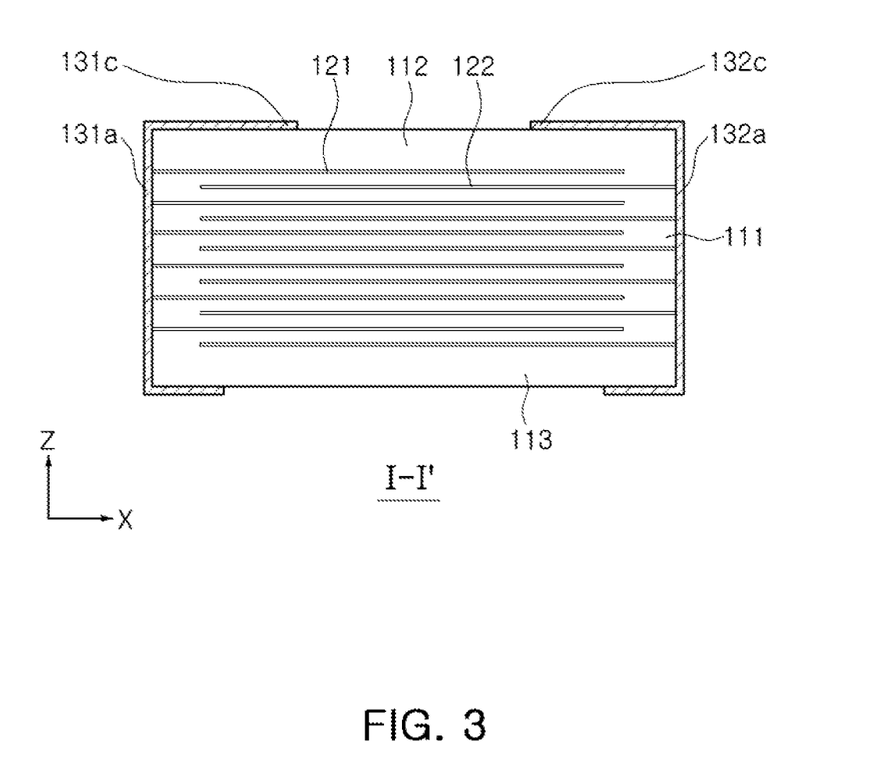
FIG. 3 is a cross-sectional view taken along line I-I' in FIG. 1.

Referring to FIGS. 1 to 3, a multilayer capacitor 100 according to the present embodiment includes a body 110 and first and second external electrodes 131 and 132 disposed on external surfaces of the body 110 in an X direction defined as a first direction, respectively.

The body 110 is formed by laminating a plurality of dielectric layers 111 in a Z direction and sintering the laminated dielectric layers 111. Adjacent dielectric layers 111 of the body 110 may be integrated with each other so that boundaries therebetween may not be readily apparent without using a scanning electron microscope (SEM).

The body 110 includes a plurality of dielectric layers 111 and first and second internal electrodes 121 and 122, having polarities different from each other, alternately disposed in the Z direction with each of the dielectric layers interposed therebetween.

The body 110 may include an active region as a portion contributing to formation of capacitance of a capacitor, and cover regions 112 and 113 as margin portions prepared in upper and lower portions of the body 110 in the Z direction.

The body 110 is not limited in shape, but may have a hexahedral shape. The body 110 may have first and second surfaces 1 and 2 disposed to oppose each other in the Z direction, third and fourth surfaces 3 and 4 connected to the first and second surfaces 1 and 2 and disposed to oppose each other in the X direction, and fifth and sixth surfaces 5 and 6 connected to the first and second surfaces 1 and 2 as well as the third and fourth surfaces 3 and 4 and disposed to oppose each other in the Y direction.

The dielectric layer 111 may include ceramic powder particles, for example, a barium titanate ($BaTiO_3$)-based ceramic powder particles or the like.

The $BaTiO_3$-based ceramic powder particles may be $(Ba_{1-x}Ca_x)TiO_3$, $Ba(Ti_{1-y}Ca_y)O_3$, $(Ba_{1-x}Ca_x)(Ti_{1-y}Zr_y)O_3$, or $Ba(Ti_{1-y}Zr_y)O_3$ in which calcium (Ca) or zirconium (Zr) is partially employed in $BaTiO_3$, but a material of the ceramic powder particles is not limited thereto.

In addition to the ceramic powder particles, a ceramic additive, an organic solvent, a plasticizer, a binder, and a dispersing agent may be further added to the dielectric layer 111.

The ceramic additive may include, for example, a transition metal oxide or a transition metal carbide, a rare earth element, magnesium (Mg), aluminum (Al), or the like.

The first and second internal electrodes 121 and 122, as electrodes applied with different polarities, may be disposed on the dielectric layer 111 to be laminated in the Z direction. The first and second internal electrodes 121 and 122 may be alternately disposed to oppose each other with a single dielectric layer 111 interposed therebetween inside the body 110 in the Z direction.

One ends of the first and second electrodes 121 and 122 may be exposed through the third and fourth surfaces 3 and 4 of the body 110, respectively.

In this case, the first and second internal electrodes 121 and 122 may be electrically insulated by a dielectric layer 111 interposed therebetween.

End portions of the first and second electrodes 121 and 122 alternately exposed through the third and fourth surfaces 3 and 4 of the capacitor body 110 may be connected to the first and second external electrodes 131 and 132 disposed on both end portions of the body 110 in the X direction, which will be described later, to be electrically connected thereto, respectively.

According to the above-described configuration, charges are accumulated between the first and second internal electrodes 121 and 122 when a predetermined voltage is applied to the first and second external electrodes 131 and 132.

In this case, capacitance of the multilayer capacitor 100 may be proportional to an overlapping area between the first and second internal electrodes 121 and 122 overlapping each other in the active region in the z direction.

The first and second inner electrodes 121 and 122 may be formed using a conductive paste formed of at least one of a noble metal material such as platinum (Pt), palladium (Pd), and a palladium-silver (Pd—Ag) alloy, nickel (Ni), and copper (Cu).

The conductive paste may be printed by means of a screen printing method, a gravure printing method, or the like, but the printing method is not limited thereto.

The first and second external electrodes 131 and 132 may be provided with voltages having different polarities and may be disposed on both end portions of the body 110 in the X direction. The first and second external electrodes 131 and 132 may be connected to the exposed end portions of the first and second internal electrodes 121 and 122, respectively, to be electrically connected to each other.

The first external electrode 131 is disposed on one end portion of the body 110 in the X direction.

The first external electrode 131 may include a first head portion 131a and first band portions 131b and 131c.

The first head portion 131a is disposed on the third surface 3 of the body 110 and is in contact with a portion of the first internal electrode 121 exposed outwardly through the third surface 3 of the body 110, serving to connect the first internal electrode 121 and the first external electrode 131 to each other.

The first band portions 131b and 131c extend from the head portion 131a to portions of the first, second, fifth, and sixth surfaces 1, 2, 5, and 6 of the body 110.

The first band portion 131c disposed on the second surface 2 corresponding to a bonding surface of the body 110, which will be described later, may include a first extending portion.

The second external electrode 132 may be disposed on the other end portion of the body 110 in the X direction.

The second external electrode 132 may include a second head portion 132a and second band portions 132b and 132c.

The second head portion 132a is disposed on the fourth surface 4 of the body 110 and is in contact with a portion of the second internal electrode 122 exposed outwardly through the fourth surface 4 of the body 110, serving to connect the second internal electrode 122 and the second external electrode 132 to each other.

The second band portions 132b and 132c extend from portions of the first to fourth surfaces 1, 2, 3, and 4 of the body 110.

The second band portion 132c disposed on the second surface 2 corresponding to a bonding surface of the body 110, which will be described later, may include a second extending portion.

The first and second external electrodes 131 and 132 may further include plating layers.

The plating layers may include first and second nickel (Ni) plating layers and first and second tin (Sn) plating layers covering the first and second nickel plating layers, respectively.

Figure 4:
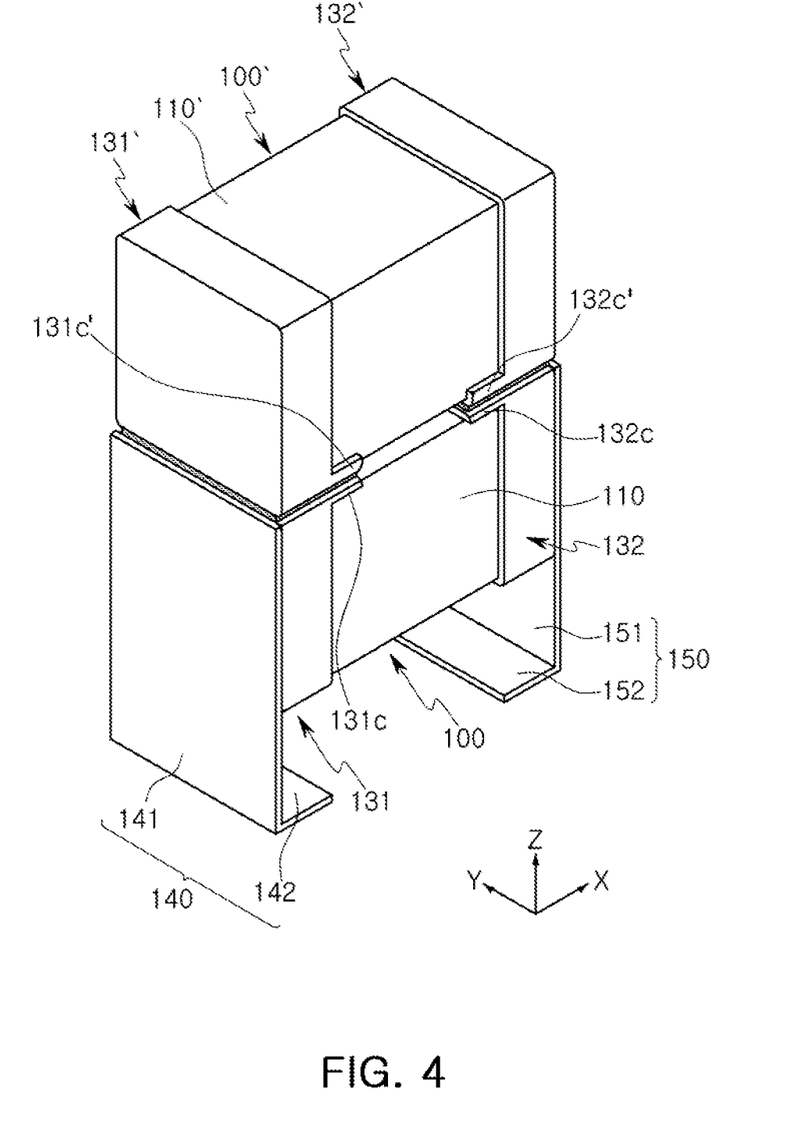
FIG. 4 is a perspective view illustrating a schematic structure of an electronic component applied to an exemplary embodiment in the present disclosure.
Figure 5:
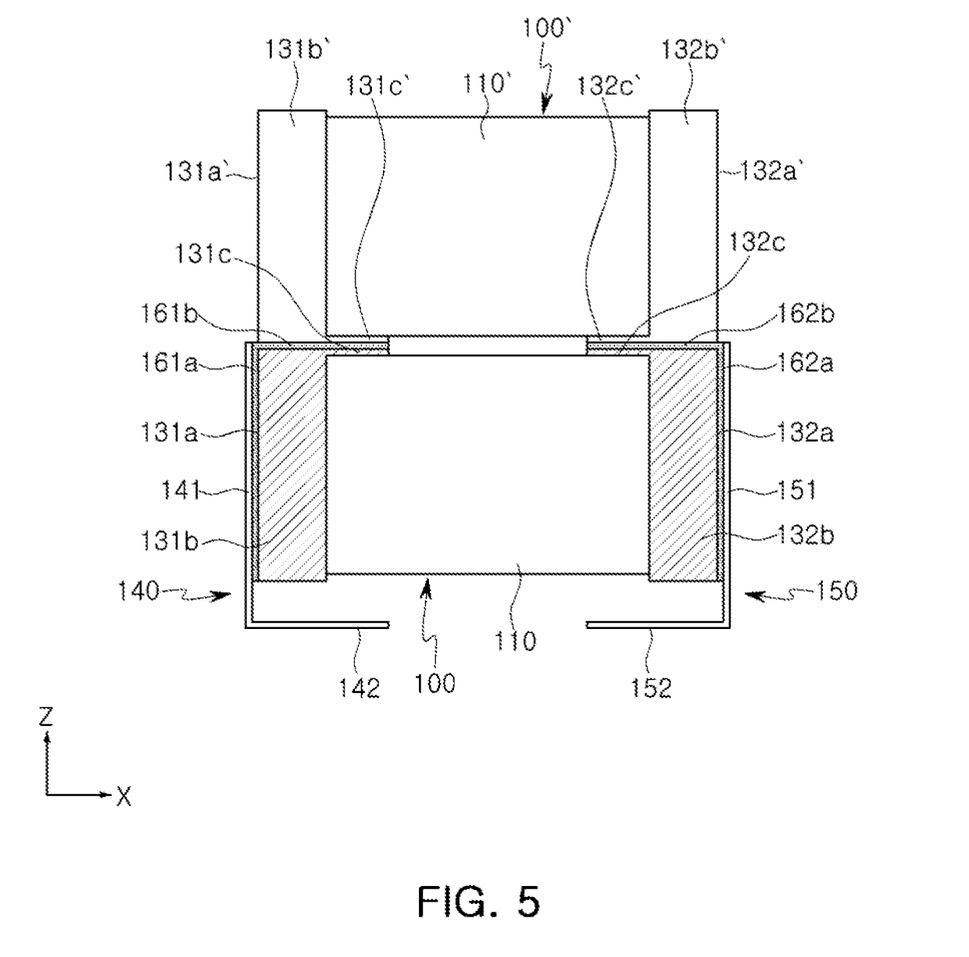
FIG. 5 is a front view of FIG. 4.

FIG. 4 is a perspective view illustrating a schematic structure of an electronic component applied to an exemplary embodiment in the present disclosure, and FIG. 5 is a front view of FIG. 4.

Referring to FIGS. 4 and 5, an electronic component according to the present embodiment includes a capacitor array including a plurality of multilayer capacitors 100 and 100' disposed in a Z direction, a vertical direction, and a first metal frame 140 connected to a first external electrode 131 of a lowermost multilayer capacitor 100 in the capacitor array in the Z direction and a second metal frame 150 connected to a second external electrode 132 of the lowermost multilayer capacitor 100.

In the present embodiment, the capacitor array has been described as including the two multilayer capacitors 100 and 100', disposed in the vertical direction. However, the capacitor array is not limited thereto and three or more multilayer capacitors may be laminated in the vertical direction.

Hereinafter, the capacitor array will be described. In multilayer capacitors disposed adjacent to each other in the Z direction, band portions of opposing external electrodes are bonded to each other and the external electrodes are disposed in such a manner that a band portion disposed on a bonding surface has a relatively larger area than a band portion disposed on a further surface.

To this end, the band portion disposed on the bonding surface may include an extending portion elongated in the X direction.

In the case of the lower multilayer capacitor 100 disposed downward in the Z direction, a top surface of the body 110 is a bonding surface. Therefore, a first band portion 131c disposed on the top surface of the body 110 has a relatively larger area than a first band portion 131b disposed on a further surface (a bottom surface or both side surfaces) of the body 110. In the case of the upper multilayer capacitor 100' disposed upward in the Z direction, a bottom surface of the body 110' is a bonding surface. Therefore, a first band portion 131c' disposed on the bottom surface of the body 110' has a relatively larger area than a first band portion 131b' disposed on further surfaces (a top surface or both side surfaces) of the body 110'.

Moreover, in the case of the lower multilayer capacitor 100 disposed downwardly in the Z direction, the top surface of the body 110 is a bonding surface. Therefore, a second band portion 132c disposed on the top surface of the body 110 has a relatively larger area than a second band portion 132b disposed on a further surface (a bottom surface or both side surfaces) of the body 110. In the case of the upper multilayer capacitor 100' disposed upward in the Z direction, the bottom surface of the body 110' is a bonding surface. Therefore, a second band portion 132c' disposed on the bottom surface of the body 110' has a relatively larger area than a second band portion 132b' disposed on further surfaces (a top surface or both side surfaces) of the body 110'.

Two first band portions 131c and 131c' disposed on the bonding surfaces to vertically face each other are bonded to each other by a conductive bonding portion 161b disposed therebetween. Two second band portions 132c and 132c' disposed on the bonding surfaces to vertically face each other are bonded to each other by a conductive bonding portion 162b disposed therebetween.

Each of the conductive bonding portions 161b and 162b may be formed of a high-temperature solder, a conductive adhesive, or the like, but a material thereof is not limited thereto.

For example, in the two multilayer capacitors 100 and 100' disposed vertically, the first band portions 131c and 131c' and the second band portions 132c and 132c', disposed on the bonding surface and bonded to face each other, have first and second extending portions, respectively, and have relatively larger areas than the first band portions 131b and 131b' and the second band portions 132b and 132b' disposed on a further surface. Accordingly, bonding strength of the two multilayer capacitors 100 and 100', laminated vertically, may be improved.

The first metal frame 140 may serve as a first terminal electrically connected to the first external electrode 131 of the capacitor array.

The first metal frame 140 includes a first vertical portion 141 and a first mounting portion 142.

The first vertical portion 141 is bonded to the first head portion 131a of the first external electrode 131 of the lower multilayer capacitor 100 to be electrically connected to the first external electrodes 131 and 131' of the capacitor array, and may be longer than the first head portion 131a in the Z direction.

A conductive bonding portion 161a may be disposed between the first vertical portion 141 and the first head portion 131a.

The first mounting portion 142 is bent at a lower end of the first vertical portion 141 to extend in the X direction and is spaced apart from a lowermost multilayer capacitor 100, for example, a lower end of the capacitor array in the Z direction by a predetermined distance. The first mounting portion 142 may serve as a connection terminal during board mounting.

The second metal frame 150 may serve as a second terminal electrically connected to the second external electrode 132 of the capacitor array.

The second metal frame 150 includes a second vertical portion 151 and a second mounting portion 152.

The second vertical portion 151 is bonded to the second head portion 132a of the second external electrode 132 of the lower multilayer capacitor 100 to be electrically connected to the second external electrodes 132 and 132 of the capacitor array, and may be disposed to be longer than the second head portion 132a in the Z direction.

A conductive bonding portion 162a may be disposed between the second vertical portion 151 and the second head portion 132a.

The second mounting portion 152 is bent at a lower end of the second vertical portion 151 to extend in the X direction and is spaced apart from a lowermost multilayer capacitor 100, for example, a bottom surface of the capacitor array in the Z direction by a predetermined distance. The second mounting portion 152 may serve as a connection terminal during board mounting.

According to the present embodiment, a capacitor array including a plurality of multilayer capacitors may be provided to implement high capacitance. A distance between the capacitor array and a mounting board may be secured using a metal frame to prevent stress from the board from being directly transmitted to the multilayer capacitor during board mounting. As a result, thermal reliability and mechanical reliability of an electronic component may be improved.

In the case in which a metal frame is respectively bonded to both side surfaces of the capacitor array, a bonding state is good at room temperature. However, under an environment in which a use temperature varies significantly (for example, an electrical component), stress may be generated at a bonding boundary by a difference in a coefficient of thermal expansion between a metal frame and an external electrode of a multilayer capacitor bonded to each other and a bonding strength may be reduced by thermal and mechanical impacts to debond the multilayer capacitor from the metal frame.

Similarly to the present embodiment, when a plurality of multilayer capacitors are vertically disposed, separation between the multilayer capacitor and a metal frame as well as debonding between vertically laminated multilayer capacitors may additionally occur.

To address the above disadvantages, a nonconductive adhesive is applied to laminated multilayer capacitors to enhance bonding strength in the related art.

However, the nonconductive adhesive is mostly organic materials and polymers, and significant stress may be easily applied to a multilayer capacitor. Accordingly, when the polymers strongly hold the multilayer capacitor to maintain bonding under the significant stress, cracking may occur in the multilayer capacitor.

The probability of a short-circuit occurring between terminals due to humidity in an organic material may be increased by a hydroscopic tendency of the organic material.

However, according to the present embodiment, separation between a multilayer capacitor and a metal frame as well as separation between vertically laminated multilayer capacitors may be suppressed when an electronic component is fabricated as a capacitor array type. Thus, reliability of an electronic component may be improved.

Figure 6:
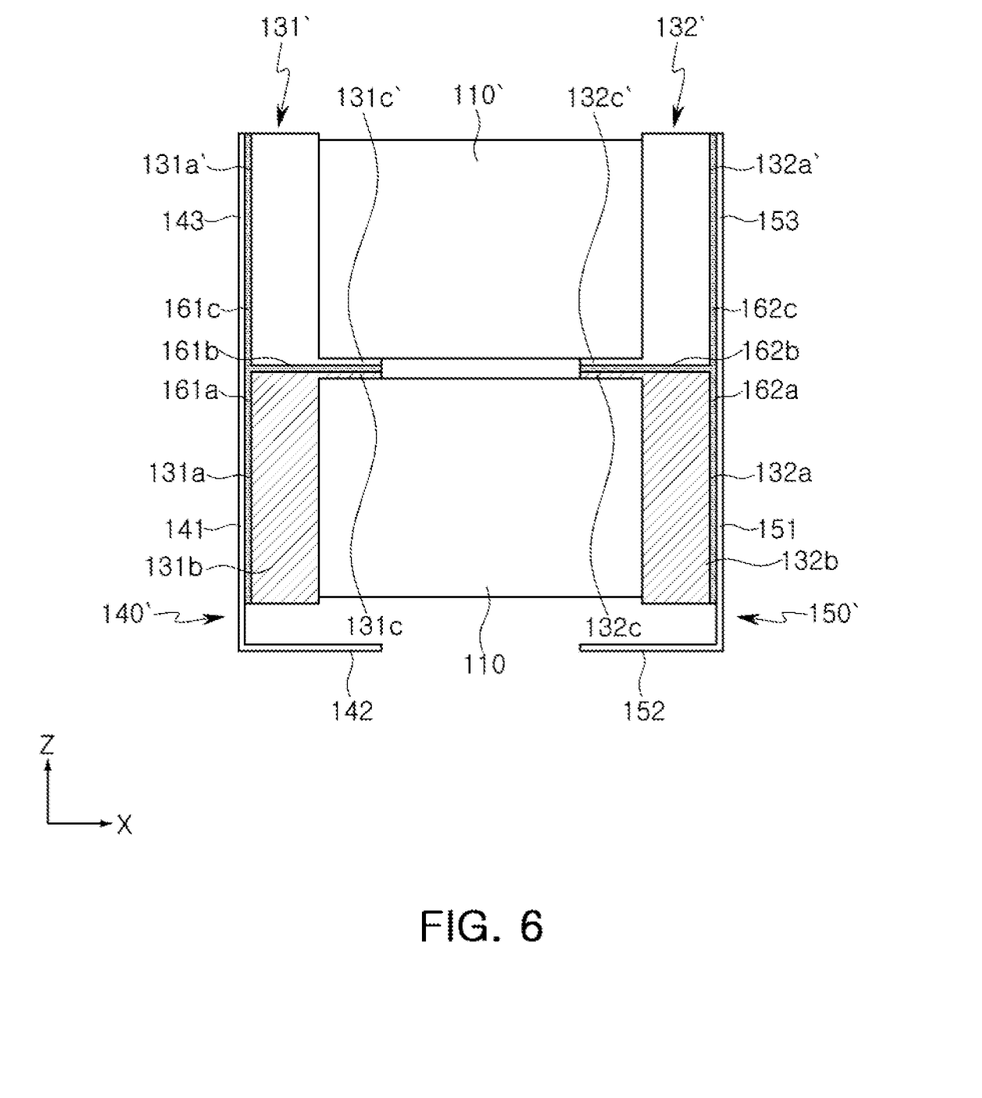
FIG. 6 is a front view illustrating a schematic structure of an electronic component applied to another exemplary embodiment in the present disclosure.

FIG. 6 is a front view illustrating a schematic structure of an electronic component applied to another exemplary embodiment in the present disclosure.

Referring to FIG. 6, first and second metal frames 140' and 150' and first and second vertical portions 141 and 151 may further include first and second extending portions 143 and 153, respectively.

The first extending portion 143 extends from an upper end of the first vertical portion 141 in a Z direction, and is bonded to a first head portion 131a' of a first external electrode 131' of an upper multilayer capacitor 100' to further improve bonding strength between a first metal frame 140' and upper and lower multilayer capacitors 100 and 100'.

A conductive bonding portion 161c may be disposed between the first extending portion 143 and the first head portion 131a' of the upper multilayer capacitor 100'.

A second extending portion 153 extends from an upper end of a second vertical portion 151 in the Z direction, and is bonded to a second head portion 132a' of a second external electrode 132' of the upper multilayer capacitor 100' to further improve between a second metal frame 150' and the upper and lower multilayer capacitors 100 and 100'.

A conductive bonding portion 162c may be disposed between the second extending portion 153 and the second head portion 132a' of the upper multilayer capacitor 100'.

Figure 7:
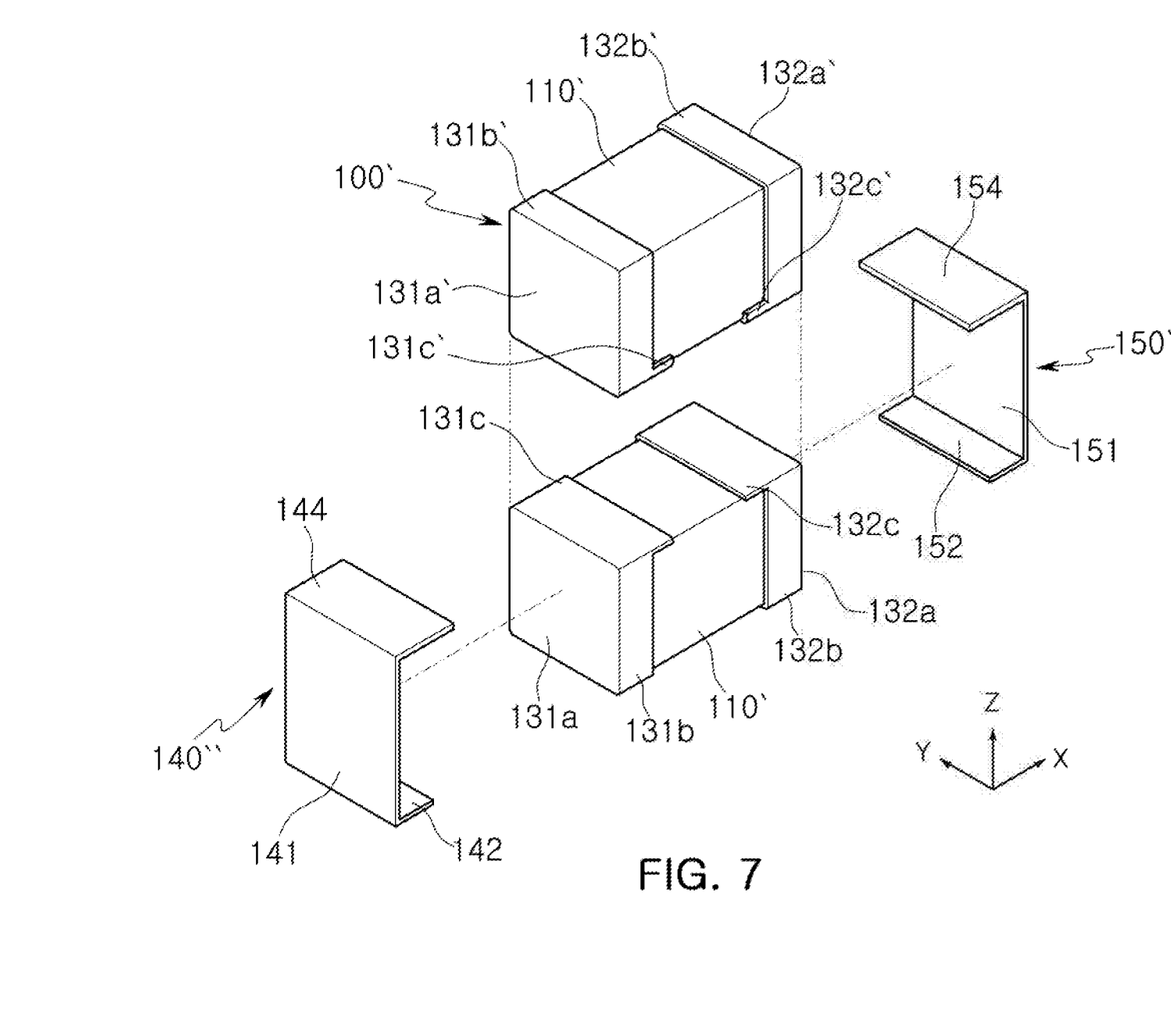
FIG. 7 is an exploded perspective view illustrating a schematic structure of an electronic component applied to another exemplary embodiment in the present disclosure.
Figure 8:
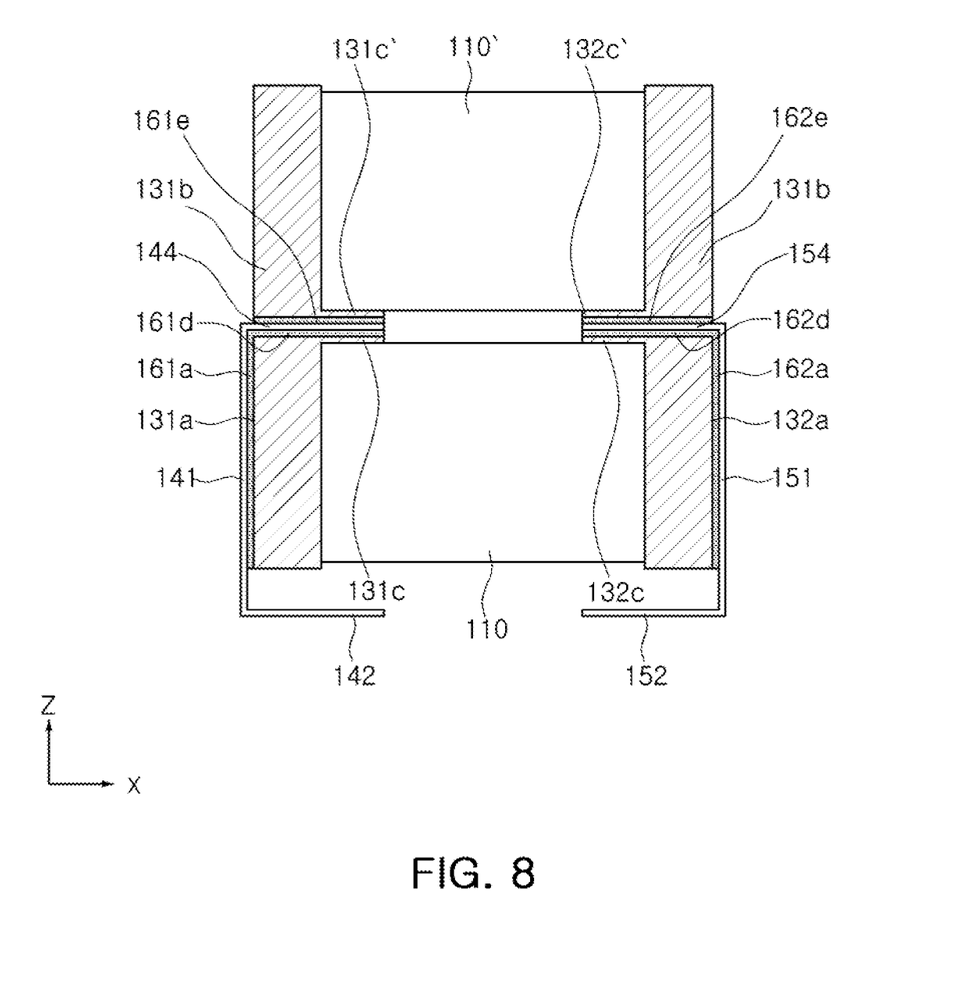
FIG. 8 is a front view of FIG. 7.

FIG. 7 is an exploded perspective view illustrating a schematic structure of an electronic component applied to another exemplary embodiment in the present disclosure, and FIG. 8 is a front view of FIG. 7.

Referring to FIGS. 7 and 8, first and second metal frames 140" and 150" may further include first and second bonding portions 144 and 154, respectively.

The first bonding portion 144 is bent from an upper end of a first vertical portion 141 and extends in an X direction to be disposed between opposing first band portions 131c' and 131c of the upper and lower multilayer capacitors 100' and 100.

Conductive bonding portions 161d and 161e may be disposed between the first bonding portion 144 and the first band portion 131c and between the first bonding portion 144 and the first band portion 131c', respectively, to further improve bonding strength between the first metal frame 140" and the upper and lower multilayer capacitors 100' and 100.

The second bonding portion 154 is bent from an upper end of a second vertical portion 151 and extends in an X direction to be disposed between opposing second band portions 132c' and 132c of the upper and lower capacitors 100' and 100.

Conductive bonding portions 162d and 162e may be disposed between the second boding portion 154 and the second band portion 132c and between the second bonding portion 154 and the second band portion 132c', respectively, to further improve bonding strength between the second metal frame 140" and the upper and lower multilayer capacitors 100' and 100.

Figure 9:
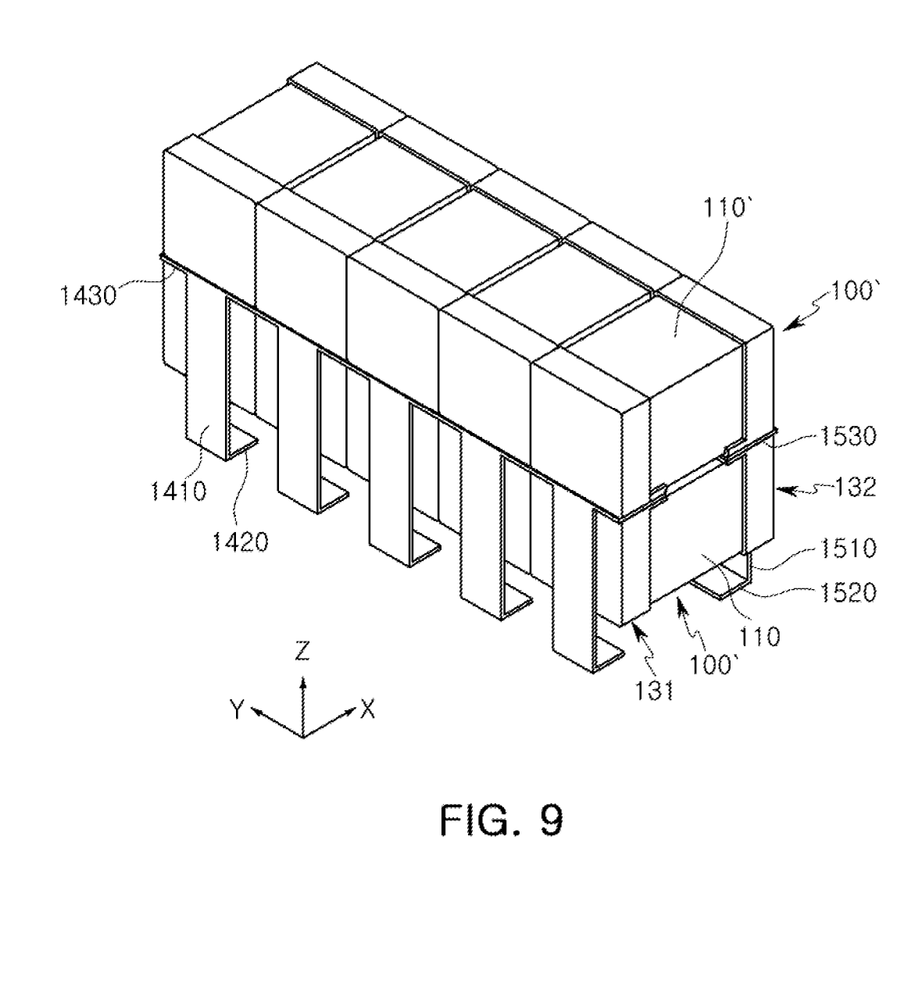
FIG. 9 is a perspective view illustrating a schematic structure of an electronic component applied to another exemplary embodiment in the present disclosure.
Figure 10:
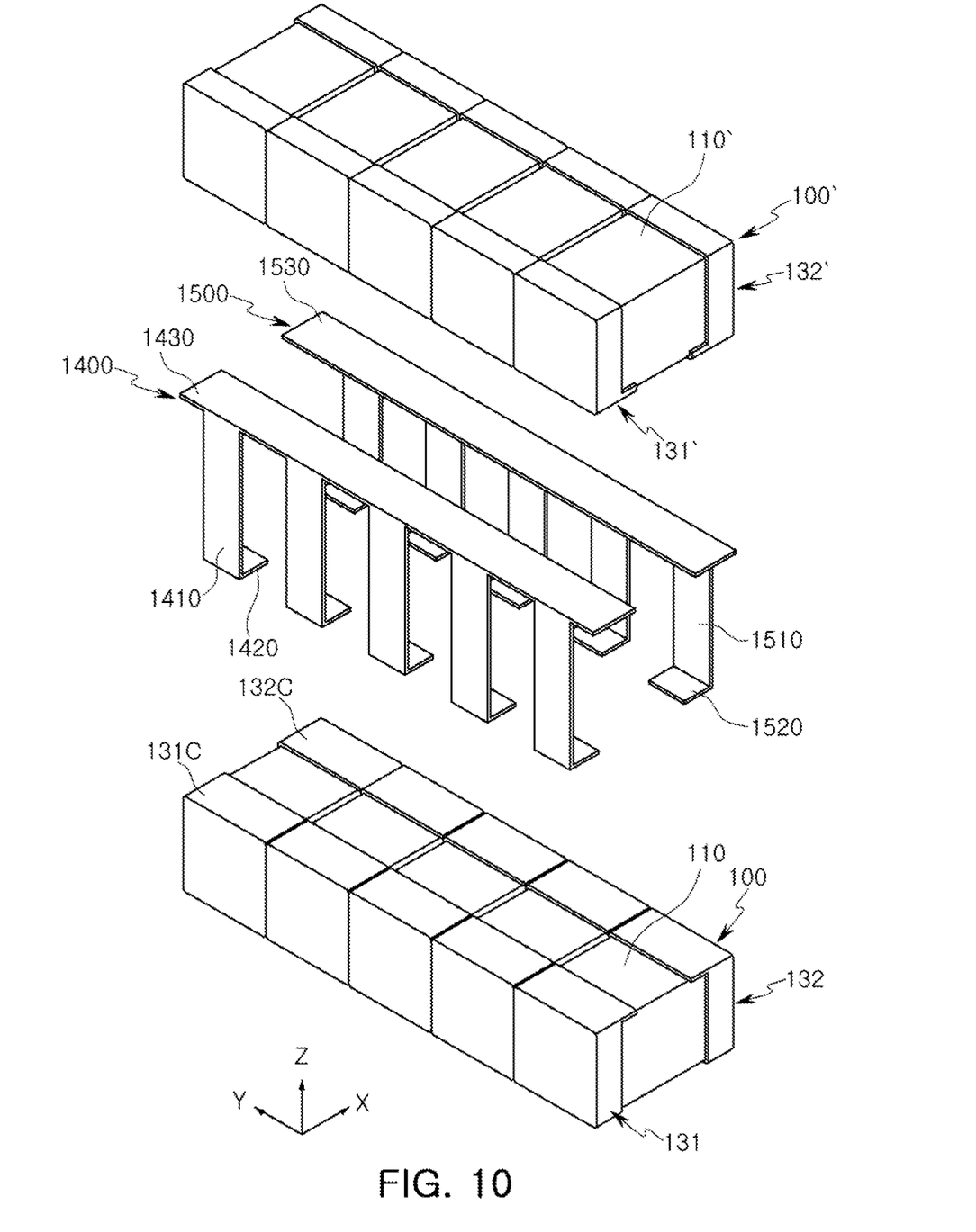
FIG. 10 is an exploded perspective view of FIG. 9.

FIG. 9 is a perspective view illustrating a schematic structure of an electronic component applied to another exemplary embodiment in the present disclosure, and FIG. 10 is an exploded perspective view of FIG. 9.

Referring to FIGS. 9 and 10, the electronic component may further include a plurality of multilayer capacitors 100 and 100' disposed in a Y direction, a horizontal direction.

A first metal frame 1400 is bonded to first external electrode 131 and 131' of a plurality of multilayer capacitors 100 and 100', serving as a common electrode to connect adjacent first external electrodes 131 and 131' to each other.

The first metal frame 1400 includes a first bonding portion 1430, a first mounting portion 1420, and a first vertical portion 1410.

The first bonding portion 1430 is elongated in the X direction and is bonded to upper side portions of the extending first band portions 131c of the plurality of first external electrodes 131 to electrically and physically connect the upper side portions of the extending first band portions 131c of the plurality of first external electrodes 131 to each other.

The first mounting portion 1420 is disposed to oppose the first bonding portion 1430 in a Z direction and serves as a connection terminal during board mounting.

Also the first mounting portion 1420 is disposed to be spaced apart from a bottom surface of the multilayer capacitor 100 in the Z direction by a predetermined distance.

The first vertical portion 1410 extends downwardly from a tip of the first bonding portion 1430 in such a manner that a lower end of the first vertical portion 1410 is connected to a tip of the first mounting portion 1420.

A plurality of first vertical portion 1410 are bonded to first head portions 131a of the first external electrodes 131, respectively, to electrically and physically connect the first head portions 131a of the first external electrodes 131 to each other in the X direction.

A second metal frame 1500 is bonded to second external electrodes 132 and 132' of the plurality of multilayer capacitors 100 and 100', serving as a common electrode connecting adjacent second external electrodes 132 and 132' to each other.

The second metal frame 1500 includes a second bonding portion 1530, a second mounting portion 1520, and a second vertical portion 1510.

The second bonding portion 1530 is elongated in the X direction and is bonded to upper side portions of the extending first band portions 132c of the plurality of second external electrodes 132 to electrically and physically connect the upper side portions of the extending second band portions 132c of the plurality of second external electrodes 132 to each other.

The second mounting portion 1520 is disposed to oppose the second bonding portion 1530 in the Z direction and serve as a connection terminal during board mounting.

Also the second mounting portion 1520 is disposed to be spaced apart from the bottom surface of the multilayer capacitor 100 in the Z direction by a predetermined distance.

The second vertical portion 1510 extends downwardly from a tip of the second bonding portion 1530 in such a manner that a lower end of the second vertical portion 1510 is connected to a tip of the second mounting portion 1520.

A plurality of second vertical portions 1510 are bonded to second head portions 132 of the plurality of second external electrodes 132, respectively, to electrically and physically connect the second head portions 132 of the plurality of second external electrodes 132 to each other in the X direction.

A first lower band portion of the upper multilayer capacitor 100' is bonded onto the first bonding portion 1430, and a second lower band portion thereof is bonded onto the second bonding portion 1530.

EXPERIMENTAL EXAMPLE

The experiment was performed to confirm a degree of improvement of bonding strength between a lower multilayer capacitor and an upper multilayer capacitor when the two multilayer capacitors were vertically disposed and a band portion disposed on a bonding surface, among four surfaces of a band portion of an external electrode disposed on a body, had an area greater than an area of a band portion disposed on a further surface.

Similarly to the exemplary embodiment illustrated in FIG. 6, two multilayer capacitors were vertically disposed, in detail, band portions disposed to oppose each other a Z direction were bonded to each other, and upper head portions, a vertical portion, and an extending portion were bonded to each other. Then, forces of 20N and 30N were applied in front of the upper multilayer capacitor at speed of 1 mm/min for 10 seconds, respectively, to enter the number of debonded upper multilayer capacitors. Under each condition, the number of samples was five.

In Table (1), 'a' denotes a length of a band portion having a relatively larger area in an X direction, and 'b' denotes a length of a band portion having a relatively small area in the X direction.

TABLE (1)

| | | a/b | | | |
|---|---|---|---|---|---|
| | | 1 | 1.05 | 1.1 | 1.2 | 1.5 |
| Applied | 20 N | 1EA | 0EA | 0EA | 0EA | 0EA |
| Load | 40 N | 4EA | 2EA | 0EA | 0EA | 0EA |

Referring to Table (1), 'a/b=1' is a case in which a band portion of a bonding surface has the same size as a band portion of a further surface. In this case, the upper multilayer capacitor was debonded at both applied loads of 20N and 40N In the case of 'a/b=1.05', the upper multilayer capacitor was not debonded at the applied load of 20N, while the upper multilayer capacitor was debonded at the applied load of 40N.

In the case in which a/b is greater than or equal to 1.1, the upper multilayer capacitor was not debonded at both the applied loads of 20N and 40N.

Accordingly, in detail, a/b≥1.05 in consideration of 20N that is a criterion of an applied load of a capacitor in a typical high-adhesion shipment inspection. In more detail, a/b≥1.05 in consideration of strengthened reliability criteria.

As described above, according to an exemplary embodiment, resistance to vibrations and deformation, reliability, and bonding strength between components may be improved while implementing high capacitance of an electronic component.

While exemplary embodiments have been shown and described above, it will be apparent to those skilled in the art that modifications and variations could be made without departing from the scope of the present invention as defined by the appended claims.

What is claimed is:

1. An electronic component comprising:
   a capacitor array including first and second multilayer capacitors disposed in a vertical direction, the first and second multilayer capacitors including opposing external electrodes including band portions bonded to each other, the external electrodes being disposed in such a manner that a band portion disposed on a bonding surface has an area larger than an area of a band portion disposed on a further surface other than the bonding surface;
   a pair of metal frames, each including a vertical portion bonded to a head portion of a respective one of the external electrodes of the first multilayer capacitor and a mounting portion bent at a lower end of the vertical portion; and
   a conductive bonding portion disposed between the head portion of the respective external electrode of the first multilayer capacitor and the vertical portion,
   wherein each of the metal frames further includes a bonding portion bent from the vertical portion to extend between opposing band portions of the first and second multilayer capacitors.

2. The electronic component of claim 1, wherein the band portion disposed on the bonding surface includes an extending portion, extending in a length direction.

3. The electronic component of claim 1, wherein the mounting portion is spaced apart from a lower end of the capacitor array.

4. The electronic component of claim 1, wherein each of the first and second multilayer capacitors comprises:
   a body including dielectric layers and first and second internal electrodes alternately disposed with each of the dielectric layers interposed therebetween; and
   first and second external electrodes disposed on both end portions of the body, respectively, and
   each of the first and second external electrodes comprises:
   first and second head portions disposed on both end surfaces of the body to be electrically connected to the first and second internal electrodes, respectively; and
   first and second band portions extending from the first and second head portions to portions of top and bottom surfaces of the body, respectively.

5. The electronic component of claim 1, wherein the conductive bonding portion is disposed between the bonding portion and the opposing band portions of the first and second multilayer capacitors.

6. The electronic component of claim 1, wherein the capacitor array further includes a plurality of multilayer capacitors disposed in a horizontal direction.

7. An electronic component comprising:
   first and second multilayer capacitors, wherein a first external electrode of the first multilayer capacitor includes a first band portion bonded to a second band portion of a second external electrode of the second multilayer capacitor; and
   a metal frame including a vertical portion bonded to a head portion of the first external electrode of the first multilayer capacitor, and a mounting portion bent at a lower end of the vertical portion and spaced apart from the first external electrode of the first multilayer capacitor; and
   a conductive bonding portion disposed between the head portion of the first external electrode of the first multilayer capacitor and the vertical portion,
   wherein in a direction perpendicular to the head portion of the first external electrode, the first band portion of the first external electrode is longer than another band portion of the first external electrode and the second band portion of the second external electrode is longer than another band portion of the second external electrode, and
   the metal frame further includes a bonding portion bent from the vertical portion to extend between the band portions of the first and second multilayer capacitors.

8. The electronic component of claim 7, wherein the conductive bonding portion is disposed between the bonding portion and the band portions of the first and second multilayer capacitors.

9. The electronic component of claim 7, further comprising a plurality of multilayer capacitors disposed in a horizontal direction perpendicular to a stacking direction of the first and second multilayer capacitors.

10. An electronic component comprising:
    a capacitor array including first and second multilayer capacitors disposed in a vertical direction, the first and second multilayer capacitors including opposing external electrodes including band portions bonded to each other, the external electrodes being disposed in such a manner that one band portion disposed on a bonding surface has an area larger than an area of another band portion disposed on a further surface other than the bonding surface; and
    a pair of metal frames, each including a vertical portion bonded to a head portion of a respective one of the external electrodes of the first multilayer capacitor and a mounting portion bent at a lower end of the vertical portion,
    wherein the vertical portions of the metal frames oppose each other in a length direction of the electronic component,
    a/b≥1.05, c>b, and c≤a, in which "a" denotes a length, in the length direction, of the one band portion, "b" denotes a length, in the length direction, of the another band portion, and "c" denotes a length, in the length direction, of a bonding portion of the metal frame disposed between the one band portions of the first and second multilayer capacitor.

11. The electronic component of claim 10, wherein the one band portion disposed on the bonding surface includes an extending portion, extending in the length direction.

12. The electronic component of claim 10, further comprising a conductive bonding portion disposed between the head portion of the respective external electrode of the first multilayer capacitor and the vertical portion.

13. The electronic component of claim 10, wherein the mounting portion is spaced apart from a lower end of the capacitor array.

14. The electronic component of claim 10, wherein each of the first and second multilayer capacitors comprises:
 a body including dielectric layers and first and second internal electrodes alternately disposed with each of the dielectric layers interposed therebetween; and
 first and second external electrodes disposed on both end portions of the body, respectively, and
 each of the first and second external electrodes comprises:
  first and second head portions disposed on both end surfaces of the body to be electrically connected to the first and second internal electrodes, respectively; and
  first and second band portions extending from the first and second head portions to portions of top and bottom surfaces of the body, respectively.

15. The electronic component of claim 10, wherein each of the metal frames includes an extending portion extending from an upper end of the vertical portion to be bonded to a head portion of a respective one of the external electrodes of the second multilayer capacitor.

16. The electronic component of claim 15, further comprising conductive bonding portions disposed between the head portion of the respective external electrode of the first multilayer capacitor and the vertical portion and between the head portion of the respective external electrode of the second multilayer capacitor and the extending portion.

17. The electronic component of claim 10, wherein in each of the metal frames, the bonding portion is bent from the vertical portion.

18. The electronic component of claim 10, further comprising conductive bonding portions disposed between the bonding portion and the one band portions of the first and second multilayer capacitors.

19. The electronic component of claim 10, wherein the capacitor array further includes a plurality of multilayer capacitors disposed in a horizontal direction.

20. The electronic component of claim 10, wherein $a/b \geq 1.1$.

* * * * *